United States Patent
Park et al.

(10) Patent No.: US 8,058,176 B2
(45) Date of Patent: Nov. 15, 2011

(54) METHODS OF PATTERNING INSULATING LAYERS USING ETCHING TECHNIQUES THAT COMPENSATE FOR ETCH RATE VARIATIONS

(75) Inventors: Wan-jae Park, Seoul (KR); Kaushik Arun Kumar, Beacon, NY (US); Joseph Edward Linville, Poughkeepsie, NY (US); Anthony David Lisi, Poughkeepsie, NY (US); Ravi Prakash Srivastava, Beacon, NY (US); Hermann Willhelm Wendt, Poughkeepsie, NY (US)

(73) Assignees: Samsung Electronics Co., Ltd., Gyeonggi-do (KR); International Business Machines Corproation, Armonk, NY (US); Advanced Micro Devices Corporation, Sunnyvale, CA (US); Chartered Semiconductor Manufacturing Ltd., Singapore (SG); Infineon Technologies AG, Neubiberg (DE)

( * ) Notice: Subject to any disclaimer, the term of this patent is extended or adjusted under 35 U.S.C. 154(b) by 610 days.

(21) Appl. No.: 11/861,478

(22) Filed: Sep. 26, 2007

(65) Prior Publication Data

US 2009/0081873 A1 Mar. 26, 2009

(51) Int. Cl.
*H01L 21/311* (2006.01)

(52) U.S. Cl. .................. 438/700; 438/734; 438/735

(58) Field of Classification Search .................. None
See application file for complete search history.

(56) References Cited

U.S. PATENT DOCUMENTS

| | | | | | |
|---|---|---|---|---|---|
| 6,486,070 | B1 * | 11/2002 | Ho et al. | ........................ | 438/706 |
| 6,531,402 | B2 * | 3/2003 | Nakagawa | ..................... | 438/710 |
| 6,760,529 | B2 * | 7/2004 | Chong et al. | ................... | 385/129 |
| 7,105,098 | B1 * | 9/2006 | Shul et al. | ........................ | 216/41 |
| 7,307,025 | B1 * | 12/2007 | Worsham et al. | ............. | 438/711 |
| 7,789,991 | B1 * | 9/2010 | Worsham et al. | ........ | 156/345.26 |
| 2001/0046781 | A1 * | 11/2001 | Nakagawa | ..................... | 438/725 |
| 2003/0108319 | A1 * | 6/2003 | Chong et al. | ................... | 385/129 |
| 2003/0171000 | A1 * | 9/2003 | Chung et al. | ................... | 438/712 |
| 2005/0003676 | A1 * | 1/2005 | Ho et al. | ........................ | 438/725 |
| 2005/0287815 | A1 * | 12/2005 | Lai et al. | ........................ | 438/710 |
| 2008/0188083 | A1 * | 8/2008 | Jeon et al. | ...................... | 438/703 |
| 2008/0296736 | A1 * | 12/2008 | Fu et al. | ........................ | 257/622 |
| 2009/0068767 | A1 * | 3/2009 | Sirard et al. | ....................... | 438/8 |
| 2009/0081873 | A1 * | 3/2009 | Park et al. | ...................... | 438/700 |
| 2010/0243605 | A1 * | 9/2010 | Nishizuka | ....................... | 216/67 |

FOREIGN PATENT DOCUMENTS

| | | |
|---|---|---|
| JP | 2000-091308 | 3/2000 |
| JP | 2004-071731 | 3/2004 |
| KR | 10-2005-0009799 | 1/2005 |

* cited by examiner

*Primary Examiner* — David Graybill
(74) *Attorney, Agent, or Firm* — Myers Bigel Sibley & Sajovec, P.A.

(57) ABSTRACT

Methods of forming integrated circuit devices include forming an integrated circuit substrate having an electrically insulating layer thereon and forming a mask layer pattern having at least first and second openings of different size therein, on the electrically insulating layer. First and second portions of the electrically insulating layer extending opposite the first and second openings, respectively, are simultaneously etched at first and second different etch rates. This etching yields a first trench extending adjacent the first opening that is deeper than a second trench extending adjacent the second opening. Then, the bottoms of the first and second trenches are simultaneously etched to substantially the same depths using an etching process that compensates for the first and second different etch rates.

4 Claims, 6 Drawing Sheets

METHODS OF PATTERNING INSULATING LAYERS USING ETCHING TECHNIQUES THAT COMPENSATE FOR ETCH RATE VARIATIONS

FIELD OF THE INVENTION

The present invention relates to methods of fabricating integrated circuit devices and, more particularly, to methods of patterning electrically insulating layers.

BACKGROUND OF THE INVENTION

As semiconductor devices are required to be more highly integrated, their design rules are reduced. Accordingly, it may be more challenging to form a pattern having a small line width on an integrated circuit substrate. Moreover, efforts are being made to reduce resistance of patterned integrated circuit structures. Attempts are being made to use materials having low electrical resistance and to replace inter-wiring insulating materials with lower dielectric constant insulating materials. In particular, a low dielectric constant insulating material layer may be used for a semiconductor device whose line width is small, for example, a semiconductor device having a line width of 65 nm or less. Unfortunately, the use of low dielectric constant insulating materials may result in lower device yields if the etching rates of these materials cannot be carefully controlled.

SUMMARY OF THE INVENTION

Methods of forming integrated circuit devices according to embodiments of the present invention include forming an integrated circuit substrate having an electrically insulating layer thereon. This electrically insulating layer may be an insulating layer having a relatively low dielectric constant, such as SiCOH. A mask layer pattern is formed on the electrically insulating layer. This mask layer pattern has at least first and second openings of different size (e.g., narrow and wide) therein. First and second portions of the electrically insulating layer extending opposite the first and second openings, respectively, are then simultaneously etched using the mask layer pattern as an etching mask. The first and second portions of the electrically insulating layer are etched at first and second different etch rates. As a result of these different etch rates, a first trench, which extends adjacent the first opening, is formed deeper than a second trench, which extends adjacent the second opening. The bottoms of the first and second trenches are then simultaneously etched to substantially the same depths using an etching process that compensates for the first and second different etch rates.

According to some of these embodiments, the simultaneously etching first and second portions of the electrically insulating layer includes exposing the first and second portions of the electrically insulating layer to a first etching gas including $C_xF_y$, where $2x \geq y$, $x > 0$ and $y > 0$ (e.g., $C_4F_8$, $C_4F_6$ and $C_5F_8$). The use of this first etching gas on an electrically insulating layer, such as SiCOH, will result in different average etch rates associated with the first and second portions of the electrically insulating layer. Thereafter, the step of simultaneously etching the first and second trenches may include exposing the first and second trenches to a second etching gas including $C_{x'}F_{y'}$, where $x' \leq y'$, $x' > 0$ and $y' > 0$. Alternatively, the step of simultaneously etching the first and second trenches may include exposing the first and second trenches to a second etching gas including $C_{x'}H_zF_{y'}$, where $x' \leq y'$, $x' > 0$, $y' > 0$, $z > 0$ and $z \leq y'$. More preferably, the second etching gas may include $C_{x'}H_zF_{y'}$, where $2x' \leq y'$, $x' > 0$, $y' > 0$, $z > 0$ and $z \leq y'$. For example, the second etching gas may include $CH_2F_2$ and $CHF_3$).

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals in the drawings denote like elements, and thus their description will be omitted.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, and/or elements thereof. In addition, the term "and/or" includes any and all combinations of one or more of the associated listed items.

Hereinafter, a method of fabricating a semiconductor integrated circuit device according to an embodiment of the present invention will be described with reference to FIGS. 1 through 6. FIGS. 1 through 6 are cross-sectional views sequentially illustrating processing steps included in a method of fabricating a semiconductor integrated circuit device according to an embodiment of the present invention.

Figure 1:
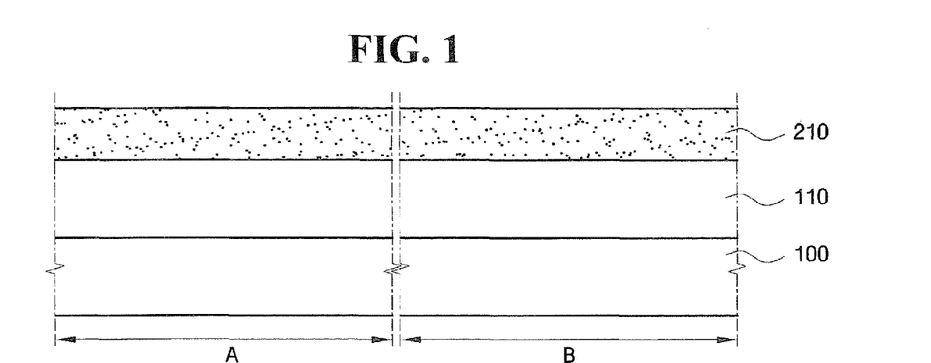
FIGS. 1 through 6 are cross-sectional views of intermediate structures that illustrate methods of fabricating a semiconductor integrated circuit device according to an embodiment of the present invention.

Referring to FIG. 1, a low dielectric constant insulating layer 110 and a mask layer 210 are formed on a semiconductor substrate 100. The semiconductor substrate 100 may be divided into a first region and a second region. Reference character 'A' indicates the first region, and reference character 'B' indicates the second region. The first region A is where a trench having a relatively small line width is formed, and the second region B is where a trench having a relatively large line width is formed. The first and second regions A and B may be a cell region and a core/peripheral region, respectively.

The semiconductor substrate 100 may be a silicon substrate, a silicon on insulator (SOI) substrate, a gallium arsenide substrate, a silicon germanium substrate, a ceramic substrate, a quartz substrate or a display glass substrate, for example. In addition, the semiconductor substrate 100 may be a P-type substrate or an N-type substrate. In most cases, the P-type substrate is used as the semiconductor substrate 100. Although not shown, a P-type epitaxial layer may be grown on the semiconductor substrate 100. The semiconductor substrate 100 may also include a P-type well (not shown) doped with p-type impurities or an N-type well (not shown) doped with n-type impurities. The semiconductor substrate 100 may include active devices, such as transistors, and interconnect devices (e.g., contact holes, wiring, contact plugs, etc.), for example.

The low dielectric constant insulating layer 110 is formed on a surface of the semiconductor substrate 100. The low dielectric constant insulating layer 110 may be an insulating layer having a dielectric constant (k) of 3.0 or less. For example, the low dielectric constant insulating layer 110 may be SiCOH. According to some embodiments of the invention, the dielectric constant of the low dielectric constant insulating layer 110 may be approximately 2.8 to 2.9. The mask layer 210 is formed on the low dielectric constant insulating layer 110. The mask layer 210 may be a single layer or a multi-layer. In addition, the mask layer 210 may be an inorganic insulating layer, such as a nitride layer, or an organic insulating layer.

Figure 2:
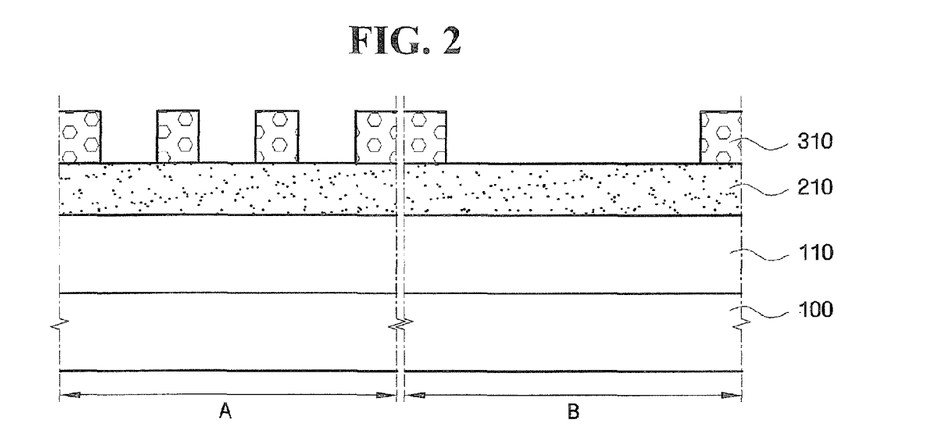

Referring to FIG. 2, a photoresist pattern 310 is formed on the mask layer 210. The photoresist pattern 310 may be formed by coating photoresist on the mask layer 210 and performing a photolithography process on the photoresist coating.

Figure 3:
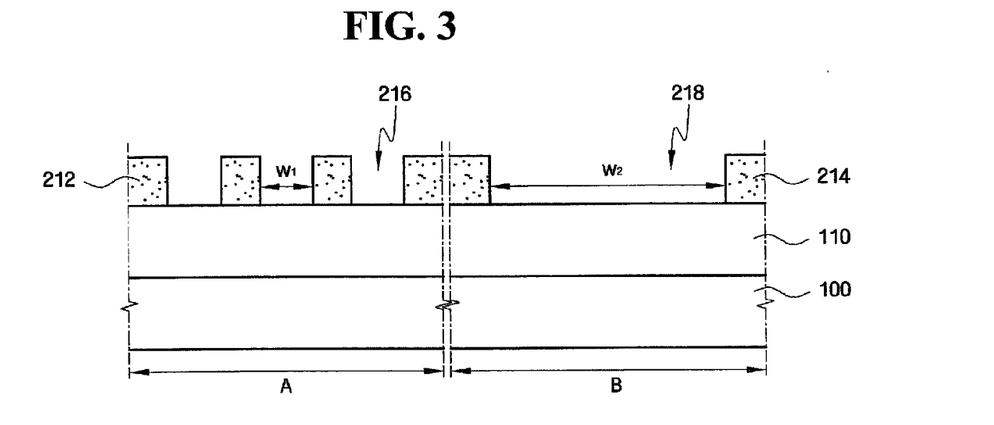

Referring to FIG. 3, the mask layer 210 of FIG. 2 is patterned using the photoresist pattern 310 as an etching mask. As a result, first and second mask layer patterns 212 and 214 are formed. In this case, the first mask layer pattern 212, having a first opening 216, is formed on the low dielectric constant insulating layer 110 in the first region A, and the second mask layer pattern 214, having a second opening 218 wider than the first opening 216, is formed on the low dielectric constant insulating layer 110 in the second region B. That is, a width $W_1$ of the first opening 216 in the first region A is less than a width $W_2$ of the second opening 218 in the second region B.

Figure 4:
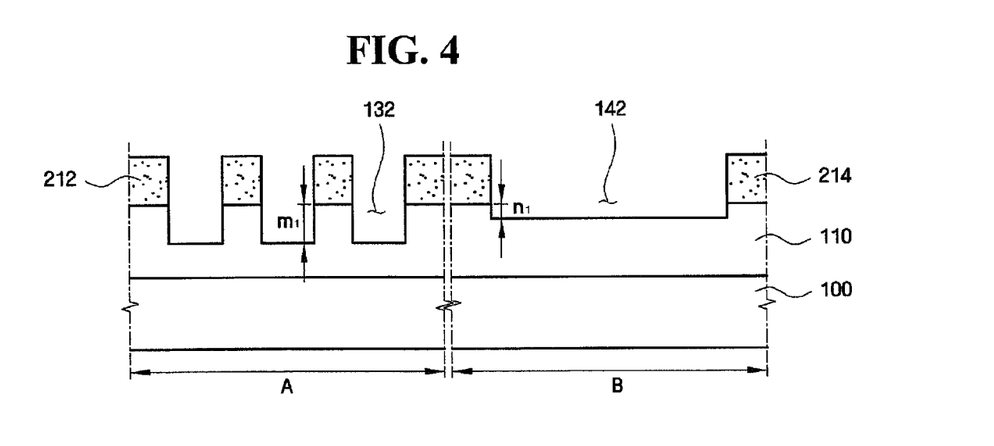

Referring to FIG. 4, a first etching process in which the low dielectric constant layer 110 is etched using the first and second mask layer patterns 212 and 214 as etching masks is performed. The first etching process may be, for example, a dry-etching process, specifically, a reactive ion etching (RIE) process. In the first etching process, a first trench 132 is formed in the low dielectric constant insulating layer 110 exposed by the first opening 216, and a second trench 142 is formed in the low dielectric constant insulating layer 110 exposed by the second opening 218. Here, an etching speed of the first trench 132 is controlled to be faster than that of the second trench 142. That is, the speed at which the inside of the first opening 216 having the small width $W_1$ is etched is controlled to be faster than the speed at which the inside of the second opening 218 having the larger width $W_2$ is etched.

In order to control the speed at which the inside of the first opening 216 having the small width $W_1$ is etched to be faster than the speed at which the inside of the second opening 218 having the larger width $W_2$ is etched, the material of an etching gas, for example, may be controlled. An etching gas used in the first etching process may include $C_xF_y$ where $2x \geqq y$. For example, the etching gas may include at least one of $C_4F_8$, $C_4F_6$, and $C_5F_8$. In addition, the etching gas used in the first etching process may not include hydrogen and may further include Ar, $O_2$, and the like. Specifically, the etching gas used in the first etching process may include $C_4F_8$, $C_4F_6$, Ar, and $O_2$.

If the first etching process is performed using the etching gas which does not include hydrogen and includes $C_xF_y$, where $2x \geqq y$, the speed at which the inside of the first opening 216 having the small width $W_1$ may be greater than the speed at which the inside of the second opening 218 having the larger width $W_2$ is etched.

Specifically, if the first etching process is performed using the etching gas which does not include hydrogen and includes $C_xF_y$, where $2x \geqq y$, a large amount of polymer may be generated during etching. In this case, if the width of a pattern to be etched is wide, the amount of polymer deposited on the pattern is large, thereby slowing down the etching speed. This slow down in speed is referred to herein as a reverse RIE lag phenomenon. If this phenomenon is significant, an etch-stop phenomenon, in which etching is no longer performed even if an etching time is increased, may occur. Since the low dielectric constant insulating layer 110 may include carbon, a large amount of polymer may be generated during etching. Therefore, if etching is performed using the low dielectric constant insulating layer 110, the etching speed may significantly vary according to the width of a pattern due to the reverse RIE lag phenomenon. Therefore, after the first etching process, a depth $m_1$ of the first trench 132 formed in the first opening 216 may be deeper than or equal to a depth $n_1$ of the second trench 142 formed in the second opening 218.

Figure 5:
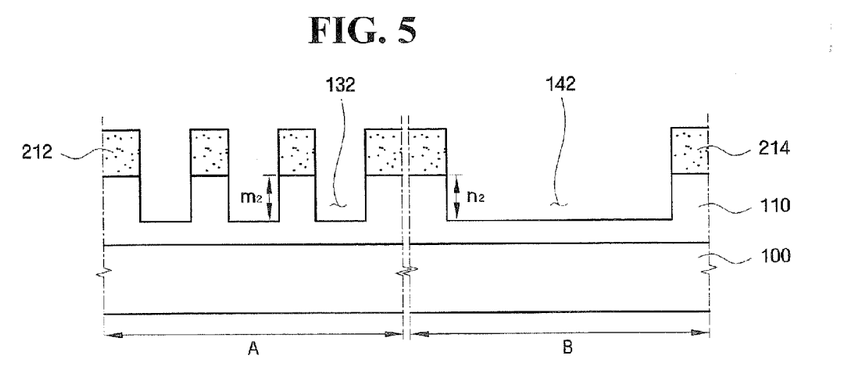

Referring to FIG. 5, a second etching process is performed in order to form the first and second trenches 132 and 142 deeper using the first and second mask layer patterns 212 and 214 as the etching masks. That is, the portions of the low dielectric constant insulating layer 110 under the first and second trenches 132 and 142 is etched deeper such that the first and second trenches 132 and 142 are formed deeper. In this case, the etching speed of the first trench 132 is controlled to be slower than that of the second trench 142. That is, the speed at which the inside of the second opening 218 having the large width $W_2$ is etched is controlled to be faster than the speed at which the inside of the first opening 216 having the smaller width $W_1$ is etched. In order to control the speed at which the inside of the second opening 218 having the large width $W_2$ is etched to be faster than the speed at which the inside of the first opening 216 having the smaller width $W_1$ is etched, the material of an etching gas, for example, may be controlled. An etching gas used in the second etching process may include $C_aH_bF_c$, which has a smaller component ratio of C than that of F and includes H, such as $CH_2F_2$ and $CHF_3$, or $C_dF_e$, which has a smaller component ratio of C than that of F, such as $CF_4$. In addition, the etching gas may include Ar, $O_2$, CO and $N_2$ for plasma formation and profile tuning.

If the second etching process is performed using the etching gas which includes $C_aH_bF_c$ having a smaller component ratio of C than that of F and containing H and $C_dF_e$ having a smaller component ratio of C than that of F, the speed at which the inside of the second opening 218 having the large width $W_2$ is etched is faster than the speed at which the inside of the first opening 216 having the smaller width $W_1$ is etched. This is because a smaller line width makes it more difficult for an etching gas to reach an opening.

Figure 6:
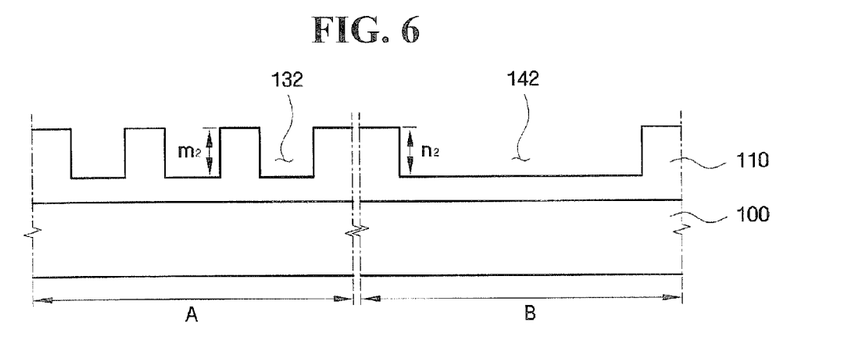

Therefore, after the second etching process, the low dielectric constant insulating layer 110 under the second trench 142 is etched deeper than the low dielectric constant insulating layer 110 under the first trench 132. Consequently, after the first and second etching processes are completed, the depth $m_2$ of the first trench 132 may be substantially equal to the depth $n_2$ of the second trench 142. Here, the phrase "substantially equal" denotes that the difference between the depth $m_2$ of the first trench 132 and the depth $n_2$ of the second trench 142 is within a measurement error range. Referring now to FIG. 6, the first and second mask layer patterns 212 and 214 of FIG. 5 are removed to yield a patterned insulating layer 110.

According to the method of fabricating the semiconductor integrated circuit device of the present embodiment, the first and second trenches 132 and 142 are formed in the first and second etching processes. Therefore, the first and second trenches 132 and 142 having different widths may be formed to have substantially equal depths. That is, trenches having substantially equal depths can be formed by simultaneously performing etching processes on regions having different line widths. Consequently, the regions can be prevented from being etched to different depths according to their line widths. Because trenches having more uniform depths can be formed, the yield and reliability of the semiconductor integrated circuit device can be enhanced.

A semiconductor integrated circuit device according to the present embodiment will now be described with reference to FIG. 6. Referring to FIG. 6, the semiconductor substrate 100 is divided into the first region A and the second region B. The first region A is where a trench having a small line width is formed, and the second region B is where a trench having a larger line width than that of the trench of the first region A is formed. The first trench 132 having the small width $W_1$ is formed in the first region A, and the second trench 142 having the larger width $W_2$ is formed in the second region B. In this case, the depth $m_2$ of the first trench 132 is substantially equal to the depth $n_2$ of the second trench 142.

Hereinafter, a method of fabricating a semiconductor integrated circuit device according to another embodiment of the present invention will be described with reference to FIGS. 7 through 12. FIGS. 7 through 12 are cross-sectional views sequentially illustrating processing steps included in a method of fabricating a semiconductor integrated circuit device according to another embodiment of the present invention. Elements substantially identical to those of the previous embodiment are identified by like reference numerals, and thus their description will be omitted.

Figure 7:
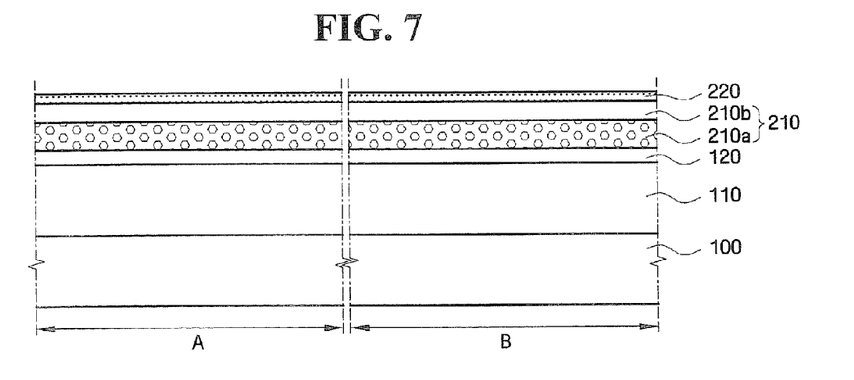
FIGS. 7 through 12 are cross-sectional views of intermediate structures that illustrate methods of fabricating a semiconductor integrated circuit device according to another embodiment of the present invention.

Referring to FIG. 7, a low dielectric constant insulating layer 110, a capping layer 120, and a mask layer 210 are formed on a semiconductor substrate 100. The semiconductor substrate 100 is divided into a first region and a second region. Reference character 'A' indicates the first region, and reference character 'B' indicates the second region. The first region A is where a trench having a small line width is formed, and the second region B is where a trench having a larger line width than that of the trench of the first region A is formed. The low dielectric constant insulating layer 110 is formed on the semiconductor substrate 100. The low dielectric constant insulating layer 110 may be an insulating layer having a dielectric constant (k) of 3.0 or less, such as SiCOH. The dielectric constant of the low dielectric constant insulating layer 110 may be approximately 2.8 to 2.9 in some embodiments of the invention. The capping layer 120 may be formed on the low dielectric constant insulating layer 110. The capping layer 120 may be, for example, $SiO_2$. The capping layer 120 prevents lifting between the low dielectric constant insulating layer 110 and an upper layer and protects the low dielectric constant insulating layer 110 during etching. In addition, the capping layer 120 inhibits formation of cracks in the low dielectric constant insulating layer 110 in a subsequent process such as a chemical mechanical planarization (CMP) process.

The mask layer 210 is formed on the low dielectric constant insulating layer 110. The mask layer 210 may be a single layer or a multi-layer. The mask layer 210 may be an inorganic insulating layer, such as a nitride layer, or an organic layer. The mask layer 210 illustrated in FIG. 7 is a double layer composed of a first mask layer 210a and a second mask layer 210b. For example, the first mask layer 210a may be an organic layer, and the second mask layer 210b may be $SiO_2$. A reflection preventive layer 220 may also be formed on the mask layer 210.

Figure 8:
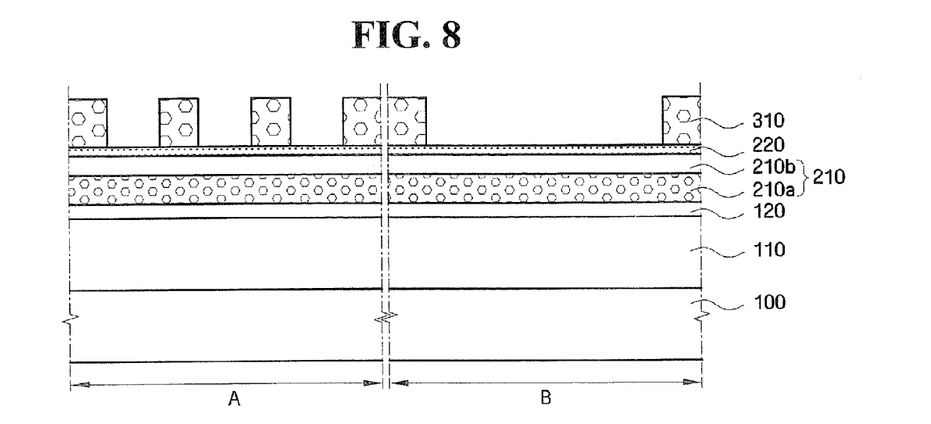

Referring to FIG. 8, a photoresist pattern 310 is formed on the reflection prevention layer 220. The photoresist pattern 310 may be formed by coating photoresist on the reflection prevention layer 220 and performing a photolithography process on the photoresist coating.

Figure 9:
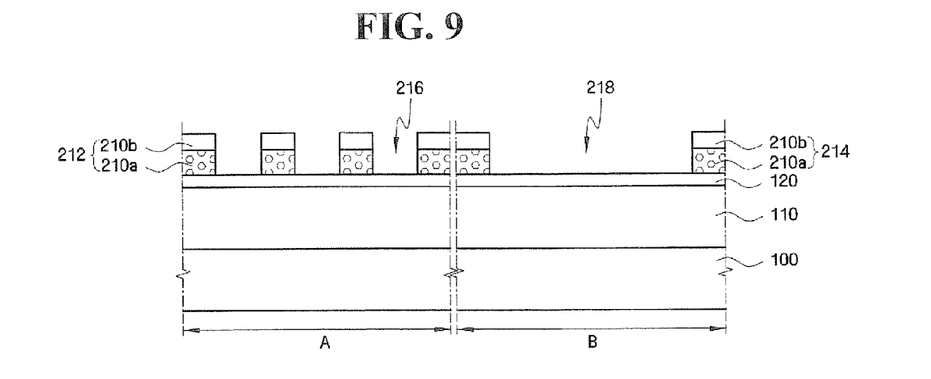

Referring to FIG. 9, the mask layer 210 is patterned using the photoresist pattern 310 of FIG. 8 as an etching mask. As a result, first and second mask layer patterns 212 and 214 are formed. In this case, the first mask layer pattern 212, having a first opening 216, is formed on the low dielectric constant insulating layer 110 in the first region A, and the second mask layer pattern 214, having a second opening 218 wider than the first opening 216, is formed on the low dielectric constant insulating layer 110 in the second region B. Accordingly, a width $W_1$ of the first opening 216 in the first region A is less than a width $W_2$ of the second opening 218 in the second region B.

Figure 10:
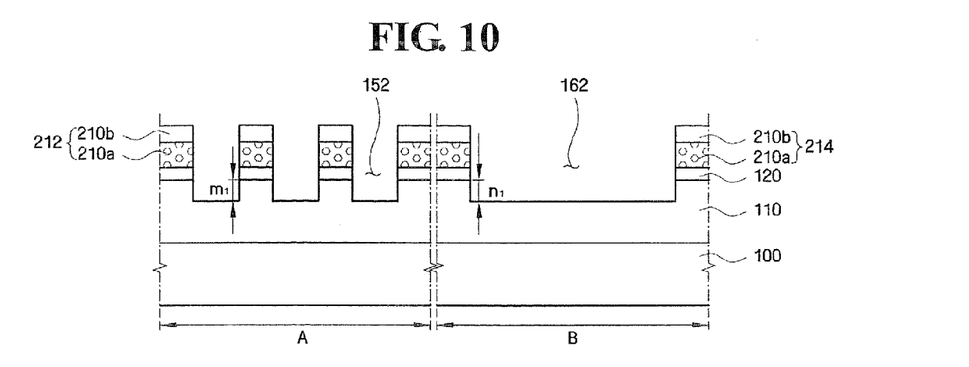

Referring to FIG. 10, a first etching process in which the low dielectric constant layer 110 is etched using the first and second mask layer patterns 212 and 214 as etching masks is performed. The first etching process may be, for example, a dry-etching process, specifically, an RIE process. That is, in the first etching process, a first trench 152 is formed in the low dielectric constant insulating layer 110 exposed by the first opening 216, and a second trench 162 is formed in the low dielectric constant insulating layer 110 exposed by the second opening 218. Here, an etching speed of the first trench 152 is controlled to be faster than that of the second trench 162. That is, the speed at which the inside of the first opening 216 having the small width W is etched is controlled to be faster than the speed at which the inside of the second opening 218 having the larger width $W_2$ is etched.

In order to control the speed at which the inside of the first opening 216 having the small width $W_1$ is etched to be faster than the speed at which the inside of the second opening 218 having the larger width $W_2$ is etched, the material of an etching gas, for example, may be controlled. An etching gas used in the first etching process may include $C_xF_y$, where $2x \geq y$. For example, the etching gas may include at least one of $C_4F_8$, $C_4F_6$, and $C_5F_8$. In addition, the etching gas used in the first etching process may not include hydrogen and may further include Ar, $O_2$, and the like. Specifically, the etching gas used in the first etching process may include $C_4F_8$, $C_4F_6$, Ar, and $O_2$. If the first etching process is performed using the etching gas which does not include hydrogen and includes $C_xF_y$, where $2x \geq y$, the speed at which the inside of the first opening 216 having the small width $W_1$ is etched is faster than the speed at which the inside of the second opening 218 having the larger width $W_2$ is etched.

Therefore, after the first etching process, a depth $m_1$ of the first trench 152 formed in the first opening 216 may be deeper than or equal to a depth $n_1$ of the second trench 162 formed in the second opening 218. Here, the capping layer 120 within the first and second openings 216 and 218 is completely etched to expose the low dielectric constant insulating layer 110. Since the first trench 152 is formed to a deeper depth $m_1$ than a depth $n_1$ of the second trench 162, the depth of the first trench 152 may be sufficiently deep to completely expose the capping layer 120 therein.

Figure 11:
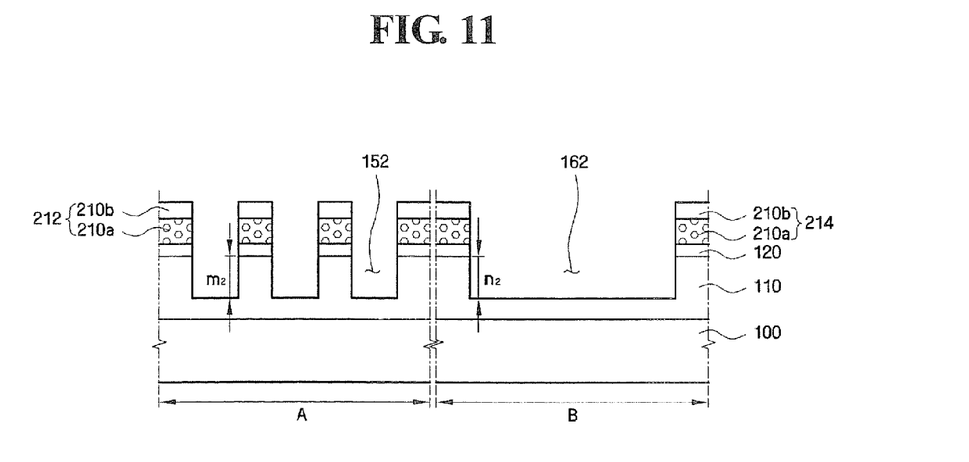

Referring to FIG. 11, a second etching process is performed in order to form the first and second trenches 152 and 162 deeper using the first and second mask layer patterns 212 and 214 as the etching masks. In particular, the low dielectric constant insulating layer 110 under the first and second trenches 152 and 162 is etched deeper such that the first and second trenches 152 and 162 are formed deeper. In this case, the etching speed of the first trench 152 is controlled to be slower than that of the second trench 162. That is, the speed at which the inside of the second opening 218 having the large width $W_2$ is etched is controlled to be faster than the speed at which the inside of the first opening 216 having the smaller width $W_1$ is etched.

In order to control the speed at which the inside of the second opening 218 having the large width $W_2$ is etched to be faster than the speed at which the inside of the first opening 216 having the smaller width $W_1$ is etched, the material of an etching gas, for example, may be controlled.

An etching gas used in the second etching process may include $C_aH_bF_c$, which has a smaller component ratio of C than that of F and includes H, such as $CH_2F_2$ or $CHF_3$, or $C_dF_e$, which has a smaller component ratio of C than that of F, such as $CF_4$. In addition, the etching gas may include Ar, $O_2$, CO and $N_2$ for plasma formation and profile tuning.

If the second etching process is performed using the etching gas which includes $C_aH_bF_c$ having a smaller component ratio of C than that of F and containing H and $C_dF_e$ having a smaller component ratio of C than that of F, the speed at which the inside of the second opening 218 having the large width $W_2$ is etched is faster than the speed at which the inside of the first opening 216 having the smaller width $W_1$ is etched. This is because a smaller line width makes it more difficult for an etching gas to reach a bottom of an opening.

Figure 12:
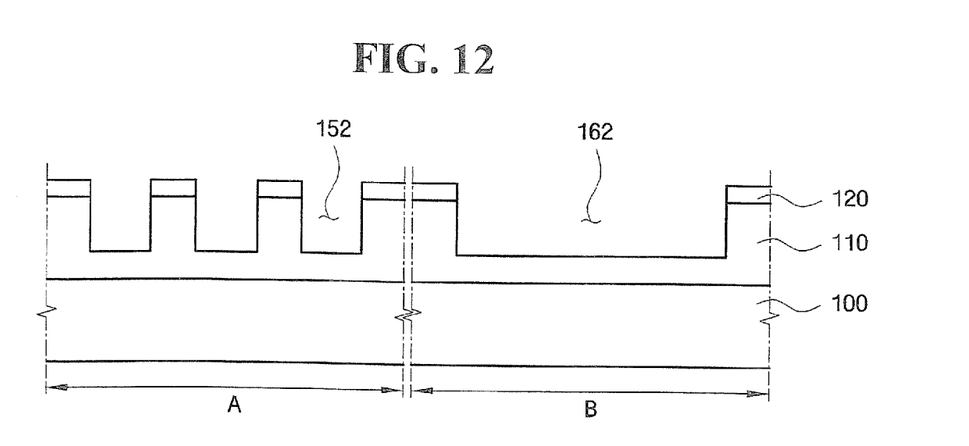

Therefore, after the second etching process, the low dielectric constant insulating layer 110 under the second trench 152 is etched deeper than the low dielectric constant insulating layer 110 under the first trench 162. Consequently, after the first and second etching processes are completed, the depth $m_2$ of the first trench 152 is substantially equal to the depth $n_2$ of the second trench 162. Here, the phrase "substantially equal" denotes that the difference between the depth $m_2$ of the first trench 152 and the depth $n_2$ of the second trench 162 is within a measurement error range. Referring now to FIG. 12, the first and second mask layer patterns 212 and 214 of FIG. 11 are removed.

According to the method of fabricating the semiconductor integrated circuit device of the present embodiment, the first and second trenches 152 and 162 are formed in the first and second etching processes. Therefore, the first and second trenches 152 and 162 having different widths may be formed to have substantially equal depths. That is, trenches having substantially equal depths can be formed by simultaneously performing alternative etching processes on regions having different line widths.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in descriptive sense only and not for purposes of limitation.

What is claimed is:

1. A method of forming an integrated circuit device, comprising:
   forming an integrated circuit substrate having an electrically insulating layer thereon;
   forming a mask layer pattern having at least first and second openings of different size therein, on the electrically insulating layer;
   simultaneously etching first and second portions of the electrically insulating layer extending opposite the first and second openings, respectively, at first and second different etch rates that yield a first trench extending adjacent the first opening that is deeper than a second trench extending adjacent the second opening, by exposing the first and second portions of the electrically insulating layer to an etching gas comprising $C_xF_y$, where $2x \geq y$, $x>0$ and $y>0$; and then
   simultaneously etching the first and second trenches to substantially the same depths using an etching process that compensates for the first and second different etch rates associated with etching the first and second portions of the electrically insulating layer, said etching process comprising exposing the first and second trenches to an etching gas comprising $C_{x'}F_{y'}$, where $2x' \leq y'$, $x'>0$ and $y'>0$;
   wherein a first width of the first openings is smaller than a second width of the second openings.

2. The method of claim 1, wherein simultaneously etching the first and second trenches comprises exposing the first and second trenches to an etching gas selected from a group consisting of $CF_4$.

3. A method of forming an integrated circuit device, comprising:
   forming a mask layer pattern having at least first and second openings of different size therein, on an electrically insulating layer;
   simultaneously etching first and second portions of the electrically insulating layer extending opposite the first and second openings, respectively, at first and second different etch rates that yield a first trench extending adjacent the first opening that is deeper than a second trench extending adjacent the second opening, by exposing the first and second portions of the electrically insulating layer to an etching gas comprising $C_xF_y$, where $2x \geq y$, $x>0$ and $y>0$; and then
   simultaneously etching bottoms of the first and second trenches at different rates using an etching process that compensates for the first and second different etch rates associated with etching the first and second portions of the electrically insulating layer, said etching process comprising exposing the first and second trenches to an etching gas comprising $C_{x'}F_{y'}$, where $2x' \leq y'$, $x'>0$ and $y'>0$;
   wherein a first width of the first openings is smaller than a second width of the second openings.

4. A method of forming an integrated circuit device, comprising:
   forming an integrated circuit substrate having an electrically insulating layer thereon;
   forming a mask layer pattern having at least first and second openings of different size therein, on the electrically insulating layer, wherein a first width of the first openings is smaller than a second width of the second openings;
   simultaneously etching first and second portions of the electrically insulating layer extending opposite the first and second openings, respectively, at first and second different etch rates that yield a first trench extending adjacent the first opening that is deeper than a second trench extending adjacent the second opening; and then
   simultaneously etching the first and second trenches to substantially the same depths using an etching process that compensates for the first and second different etch rates associated with etching the first and second portions of the electrically insulating layer.

* * * * *